(12) United States Patent
Criscione et al.

(10) Patent No.: US 6,362,663 B1
(45) Date of Patent: Mar. 26, 2002

(54) COMPARATOR CIRCUIT FOR POSITIVE AND NEGATIVE SIGNALS HAVING ZERO CONSUMPTION AND SUITABLE FOR DEVICES WITH SINGLE POSITIVE POWER SUPPLY

(75) Inventors: Marcello Criscione, Ragusa; Sergio Franco Pioppo, Mascalucia, both of (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 0 days.

(21) Appl. No.: 09/563,559

(22) Filed: May 3, 2000

(30) Foreign Application Priority Data

May 3, 1999 (IT) ......................................... MI99A0945

(51) Int. Cl.[7] .............................................. H03K 5/153
(52) U.S. Cl. .............................. 327/74; 327/80; 327/76
(58) Field of Search ............................. 327/50, 58, 74, 327/90, 415, 416, 419, 427, 574, 576, 581, 75–85

(56) References Cited

U.S. PATENT DOCUMENTS

| | | | | |
|---|---|---|---|---|
| 5,177,376 A | * | 1/1993 | Wellnitz et al. ............. | 327/205 |
| 5,418,472 A | * | 5/1995 | Moench ....................... | 326/14 |
| 5,463,335 A | * | 10/1995 | Divakaruni et al. ........ | 327/143 |
| 5,465,059 A | * | 11/1995 | Pan et al. .................... | 327/12 |
| 5,929,680 A | * | 7/1999 | Lim ............................ | 327/264 |
| 5,933,459 A | * | 8/1999 | Saunders et al. ........... | 375/317 |

* cited by examiner

*Primary Examiner*—Timothy P. Callahan
*Assistant Examiner*—Hai L. Nguyen
(74) *Attorney, Agent, or Firm*—Lisa K. Jorgenson; Allen, Dyer, Doppelt, Milbrath & Gilchrist, P.A.

(57) ABSTRACT

A comparator circuit for positive and negative signals having zero consumption and suitable for devices with a single positive power supply includes a first and second comparator connected in parallel and receiving a common input signal and, respectively, a first positive threshold voltage and a second negative threshold voltage. The comparator circuit further includes a first logic circuit cascade-connected to the first and second comparators. The first and second comparators are respectively suitable to detect the crossing on the part of the input signal of the first and second threshold voltages. The second comparator is provided by n-channel and p-channel MOS transistors of the enhancement type. The comparator circuit also includes a second logic circuit cascade-connected to the first logic circuit, and a monostable circuit connected to the second logic circuit.

36 Claims, 4 Drawing Sheets

COMPARATOR CIRCUIT FOR POSITIVE AND NEGATIVE SIGNALS HAVING ZERO CONSUMPTION AND SUITABLE FOR DEVICES WITH SINGLE POSITIVE POWER SUPPLY

FIELD OF THE INVENTION

The present invention relates to electronic circuits, and, more particularly, to a comparator circuit.

BACKGROUND OF THE INVENTION

In the case of serial interface devices internally provided with receivers and transmitters, it is important to detect the temporary absence of signals on the inputs of the receivers and to report such absence to a microprocessor The microprocessor can send a power-off signal to switch off the transmitter device of the serial interface, thus eliminating the consumption of the interface. Furthermore, the microprocessor can send a diagnostic signal to the system When a valid signal reaches the inputs of the receiver, the input is not floating or different from zero and the device resumes its normal operation.

For example, in the case of serial interfaces of the RS232 type, signals whose amplitude can vary between −30V and +30V can be present at the inputs of the receiver of the interface. Data communication occurs with signals having an amplitude of ±5V. A signal with an amplitude between −30V and +0.8V is recognized as low, whereas for amplitudes between 2.4V and +30V the input signal is considered high. A pull-own resistor forces the input to the ground value if the signal is absent.

The signal sent to the microprocessor for reporting an absence of signals on the inputs of the receivers is generated by a so-called wake-up logic output. The wake-up logic must be preset so that if the input signal of the receiver is 0 (i.e., a cable is disconnected or there is a lack of data communication) for a preset minimum time interval, then the wake-up system must be activated, sending the failure message (i.e., an absence of communication) to the microprocessor. The microprocessor stops the device, thus avoiding unnecessary power consumption. When the input signal exceeds preset thresholds, the wake-up system is deactivated and the device resumes its normal operation.

Some conventional circuits for addressing the above-described problem require static power consumption. Other conventional circuits, which may have no static consumption, are unable to simultaneously handle positive and negative signals with a single power source. In yet other conventional circuits it is necessary to use CMOS depletion type technology with the substrate connected to the highest supply voltage.

The first case, i.e., circuits that have static consumption, is illustrated by way of example in FIG. 1, which illustrates a double CMOS comparator whose static consumption is nonzero. In FIG. 1, Vtm− and Vtm+ respectively designate the negative and positive voltages, whereas Rin designates the signal input to the receiver of the interface device.

FIG. 2 illustrates a circuit which is capable of addressing the above-described problem, i.e., has zero consumption, but suffers the drawback that it is unable to detect the negative threshold in the absence of devices of the depletion type in single positive power supply conditions. Finally, FIG. 3 illustrates a third circuit using CMOS depletion type technology which has difficulty in controlling the negative threshold voltage in the NMOS transistors. This technology further has difficulties in general in providing depletion devices of the standard BiCMOS type.

SUMMARY OF THE INVENTION

One object of the present invention is to provide a comparator circuit for positive and negative signals having zero consumption and which is suitable for devices with a single positive power supply.

Another object of the present invention is to provide a comparator circuit for positive and negative signals having zero consumption and which is capable of recognizing signals below a preset negative threshold without having negative supply voltages available.

A further object of the present invention is to provide a comparator circuit for positive and negative signals having zero consumption and which allows the exclusive use of CMOS devices of the n-channel and p-channel enhancement type which are commonly integrated in conventional BiCMOS technologies.

Yet another object of the present invention is to provide a comparator circuit for positive and negative signals having zero consumption and which further has minimal silicon implementation dimensions.

Still another object of the present invention is to provide a comparator circuit for positive and negative signals having zero consumption and in which it is possible to vary the comparison thresholds independently of each other.

Another object of the present invention is to provide a comparator circuit for positive and negative signals having zero consumption and which is highly reliable and relatively easy to manufacture at competitive costs.

These and other objects are achieved by a comparator circuit for positive and negative signals having zero consumption, suitable for devices with a single positive power supply, which includes first and second comparator means connected in parallel that receive a common input signal and, respectively, a first positive threshold voltage and a second negative threshold voltage. The comparator circuit further includes a first logic means cascade-connected to the first and second comparator means The first and second comparator means are respectively suitable to detect the crossing, on the part of the input signal, of the first and second threshold voltages. The second comparator means for detecting the crossing of the second threshold is provided by virtue of n-channel and p-channel MOS transistors of the enhancement type. A second logic means is cascade-connected to the first logic means and in turn connected to a monostable circuit.

BRIEF DESCRIPTION OF THE DRAWINGS

Further characteristics and advantages of the invention will become apparent from the description of a preferred, but not exclusive, embodiment of the comparator circuit according to the invention, illustrated by way of a non-limiting example in the accompanying drawings, wherein.

DETAILED DESCRIPTION OF THE PREFERRED EMBODIMENTS

Figure 1:
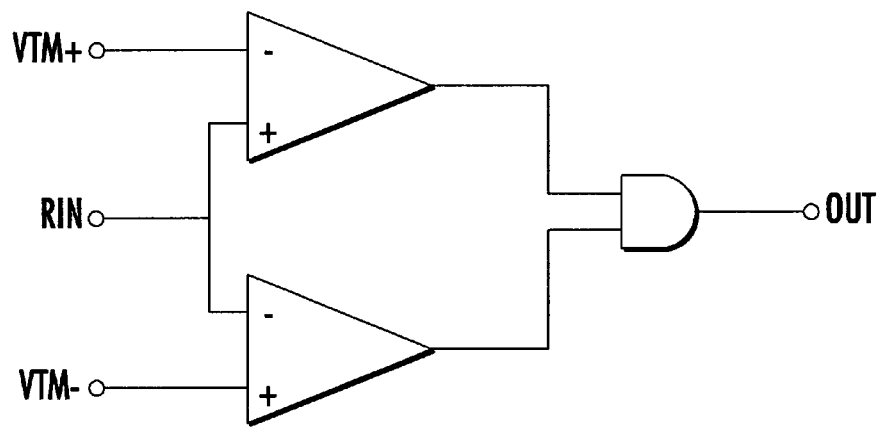
FIG. 1 is a circuit diagram of a conventional comparator circuit as in the prior art.
Figure 2:
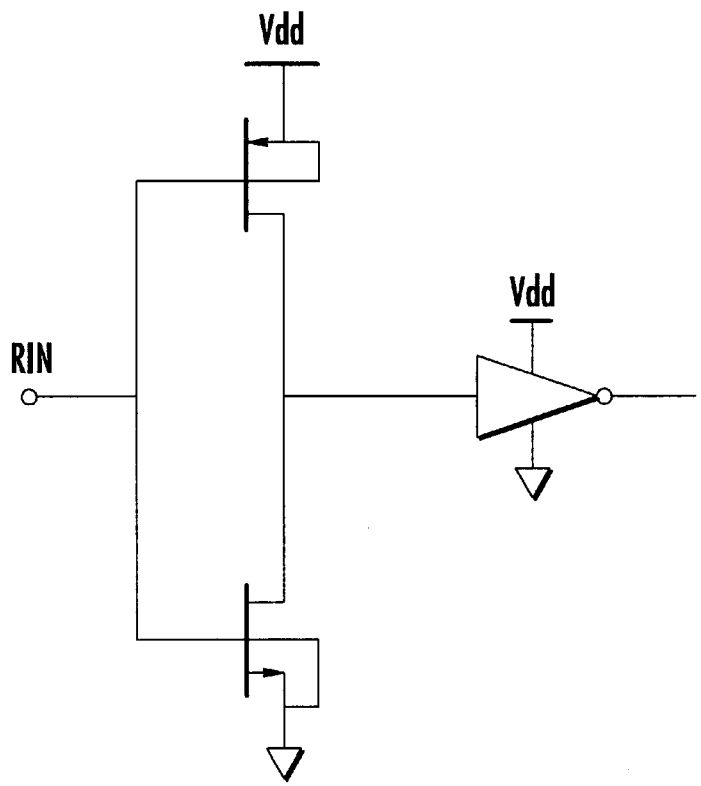
FIG. 2 is a circuit diagram of another conventional comparator circuit as in the prior art.
Figure 3:
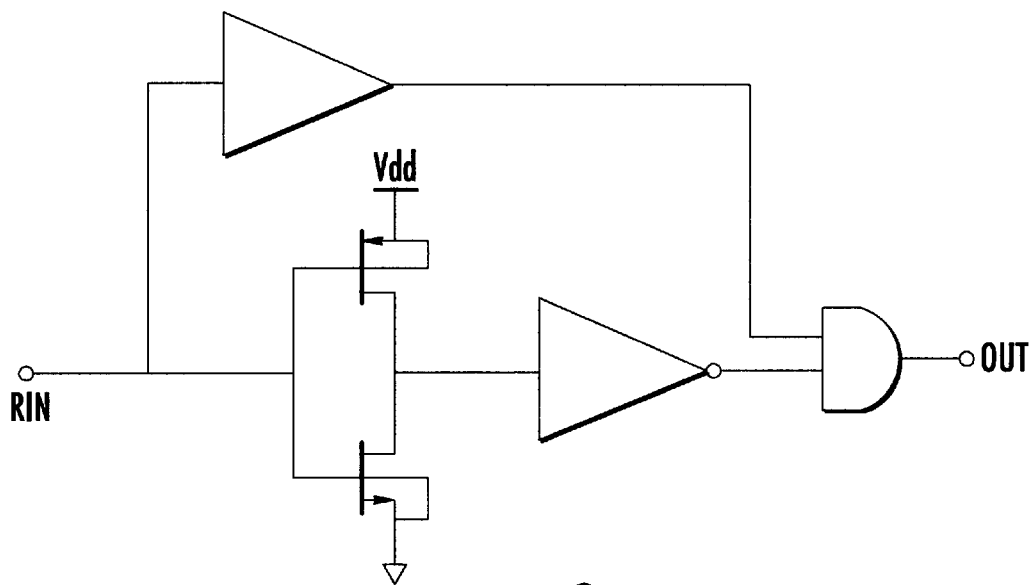
FIG. 3 is another circuit diagram of a conventional comparator circuit as in the prior art.
Figure 4:
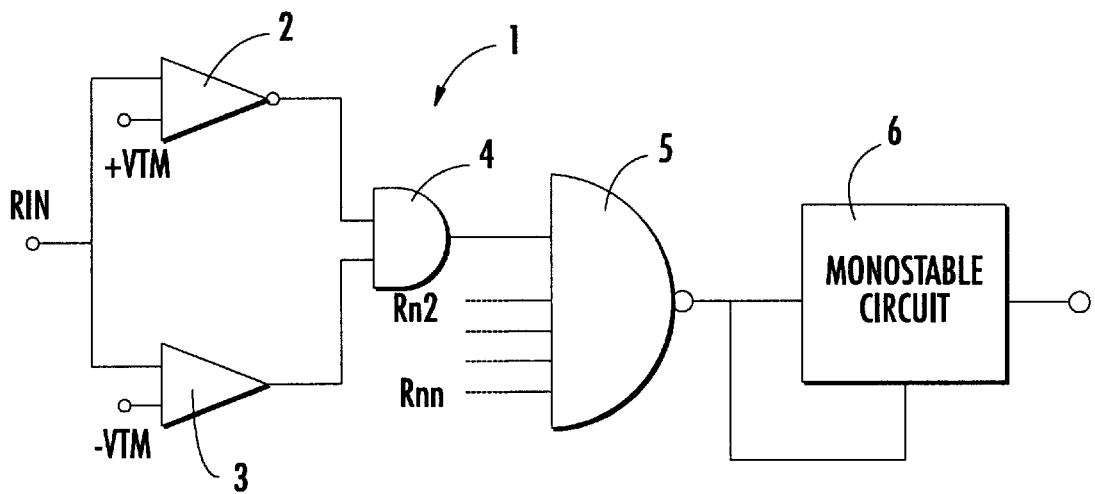
FIG. 4 is a circuit diagram of the comparator circuit according to the present invention.

FIGS. 1 to 3, which illustrate the prior art, have already been described. Therefore, with particular reference to FIGS. 4 to 7, in which identical reference numerals designate identical elements, the circuit according to the present invention is generally designated by the reference numeral 1. The circuit 1 includes a first comparator or comparator means 2 for detecting the crossing of a positive threshold by the input signal of the receiver Rin, which is set arbitrarily to the voltage +Vtm. The circuit 1 also includes a second comparator or comparator means 3 for detecting the crossing of a negative threshold, set arbitrarily to the voltage/−Vtm.

The first and second comparators 2, 3 both receive the input signal of the receiver Rin, and their outputs are sent commonly to a first logic means or circuit 4, which is provided by an AND gate. The outputs of the first and second comparators 2, 3 are thus ANDed, and for voltages of Rin<|Vtm| the first logic circuit 4 outputs a high active wake-up signal.

The circuit further includes an additional or second logic means or circuit 5 which is arranged in a cascade connection with respect to the first logic circuit 4 and is provided by a NAND gate with N inputs The additional logic circuit 5 presets the wake-up circuits to respond to the activation of at least one of the N inputs that are present in the device. Finally, the output of the additional logic circuit 5 activates a monostable circuit 6 which delays the arrival of the wake-up pulse by a time which is set arbitrarily.

Figure 6:
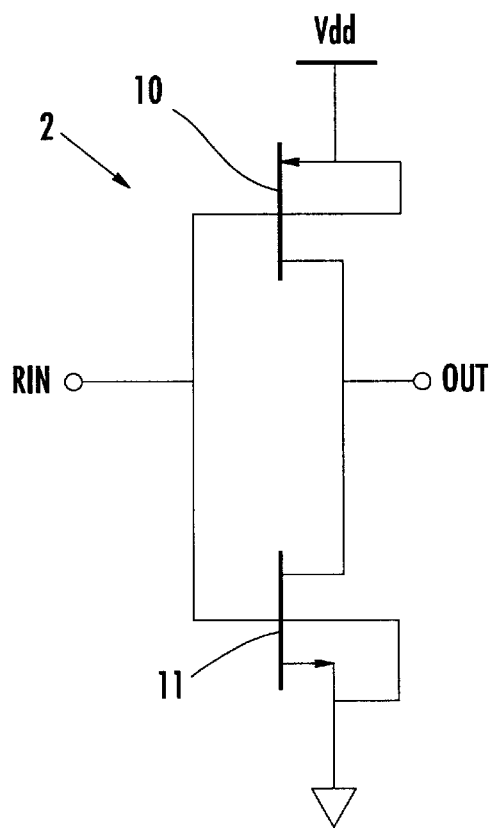
FIG. 6 is a circuit diagram of a positive threshold comparator used in the comparator circuit according to the invention, shown in FIG. 4.

The positive threshold first comparator 2 is provided by a CMOS inverter, as shown in FIG. 6, which includes two MOS transistors of the p-channel and n-channel types, designated by the reference numerals 10 and 11, respectively. The n-channel MOS transistor 11 is larger than the corresponding p-channel MOS transistor 10 in order to provide an input threshold regardless of the voltage that is supplying the circuit.

Figure 7:
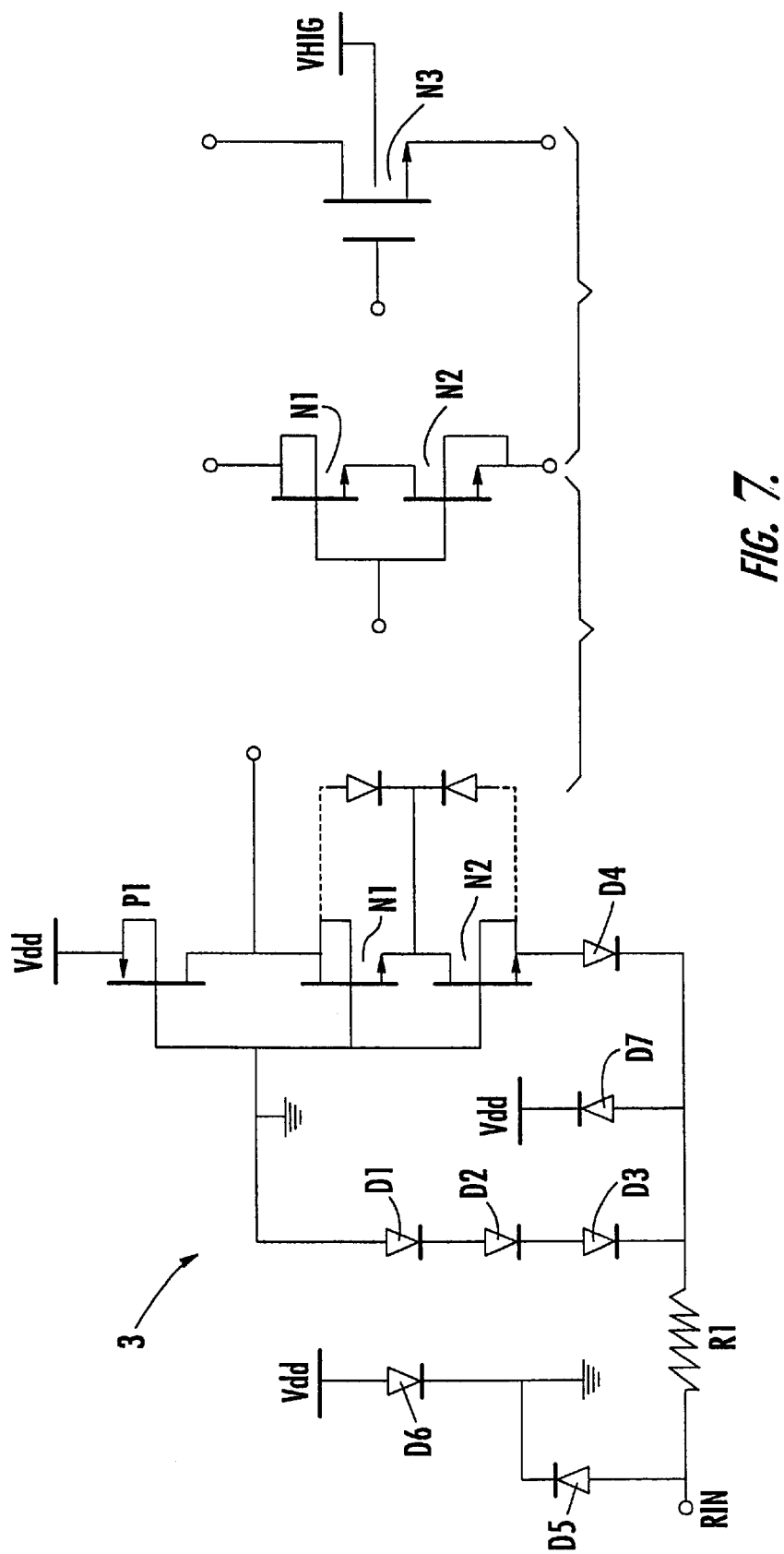
FIG. 7 is a circuit diagram of a zero consumption negative threshold comparator used in the comparator circuit according to the invention, shown in FIG. 4.

The second comparator 3 has a circuit implementation as shown in FIG. 7. The requirement to be met for the second comparator 3 is to obtain a circuit which does not absorb current from the power supplies and yet is capable of detecting when the input signal Rin crosses an arbitrarily chosen negative voltage (−Vtm). The main difficulty lies in the fact that in BiCMOS technology there are no MOS transistors of the depletion type and, therefore, with a negative threshold, and the circuit must not absorb current.

These difficulties are overcome by the circuit shown in FIG. 7, which illustrates the second comparator 3. A branch is formed by three MOS transistors, designated by the reference signs P1, N1 and N2 respectively, which are mutually series-connected. The first MOS transistor P1 is a p-channel MOS transistor, and the MOS transistors N1 and N2 are n-channel MOS transistors. The three MOS transistors P1, N1, and N2 are mutually series-connected with a common gate terminal and are connected to ground. A second circuit branch has three diodes D1, D2 and D3 which are mutually series-connected, and the anode terminal of the diode D1 connected to the common node of the gate terminals of the MOS transistors P1, N1 and N2. The cathode terminal of the diode D3 is connected to the cathode terminal of a diode D4, whose anode terminal is connected to the source terminal of the MOS transistor N2.

The cathode terminals of the diodes D3 and D4 are further connected to a resistor R1 The signal Rin is input to one terminal of the resistor R1. A diode D5 is connected so as to receive the input signal Rin at its anode terminal and is connected by its cathode terminal to ground and to the cathode terminal of an additional diode D6. The diode D6 is connected by its anode terminal to the supply voltage Vdd.

A seventh diode D7 is connected by its anode terminal to the cathode terminals of the diodes D3 and D4 and by its cathode terminal to the supply voltage Vdd. Finally, the p-channel MOS transistor P1 is connected, by its source terminal, to the supply voltage Vdd.

The operation of the second comparator shown in FIG. 7 is as follows. The p-channel MOS transistor P1, in which the source terminal is connected to the positive power supply Vdd and the gate terminal is set to the ground voltage, provides a resistive MOS device with a very long channel and, thus, a resistor having an extremely high ohmic value.

The n-channel MOS transistors N1 and N2 have gate terminals which are connected to ground voltages and are connected in a back-to-back configuration to neutralize intrinsic well diodes at the body-source and body-drain junctions of the n-channel MOS transistors. Accordingly, the pair of MOS transistors N1 and N2 is electrically equivalent to a single n-channel MOS transistor, whose body is always biased to the lowest potential that is present between ground and the voltage at the node Va.

The series diodes D1, D2 and D3 limit the fall of the point Va to the voltage -3Vbe following the application of a highly negative voltage to the input Rin. The resistor R1 limits the current that flows from the ground terminal to the terminal Rin if the voltage thereof is lower than −3Vbe. If the voltage of the terminal Rin is |V(Rin)|>[Vth(N3)+Vbe(D4)], where Vth (N3) is the threshold voltage of a MOS transistor N3, which represents here the sum of the transistors N1 and N2, and the term Vbe(D4) represents the base-emitter voltage of the diode D4, then the MOS transistor N3 is off, the diodes D1, D2 and D3 are off (since 3Vbe>>[Vth(N3)+Vbe(D4)]), and the resistive MOS transistor P1 is saturated, since current cannot flow between its source terminal and its drain terminal. The output of the second comparator 3 of FIG. 7 is therefore at the supply voltage Vdd. In these conditions, the second comparator 3 has no static current consumption.

If instead V(Rin)<−[Vth(N3)+Vbe(D4)] but |V(Rin)|<3Vbe, the MOS transistor N3 is on, the output voltage OUT is equal to −Va, indicating to the downstream stage that the threshold −[Vth(N3)+Vbe(D4)] has been crossed and causing the wake-up of the device. Under these conditions, the consumption of the circuit determined by the current that flows through P1 and N1, N2 to the terminal Rin causes only an extremely small increase in the total consumption current of the device, which is fully active and operational.

Finally, if V(Rin)<−3Vbe<−[Vth(N3)+Vbe(D4)], the circuit remains in the wake-up condition, since the MOS transistor N3 (the electrical equivalent of the pair of transistors N1 and N2) is always active. However, the current input to the terminal Rin is limited to the value I(Rin)=−|V(Rin)−3Vbe|/R1, where I(Rin) is the current input to the terminal Rin.

The limitation of the voltage that can be reached by the node Va is also meant to protect the MOS transistor N2 from possible gate oxide destruction if the maximum sustainable voltage of the technology used is exceeded. The diodes D5 and D6 are meant to bias the well of the resistor R1 of the highest voltage between Vdd and V(Rin) to prevent conduction, with any voltage applied to Rin, of the well diode of the resistor R1.

The purpose of the diode D7 is to limit the rise of the voltage of the node Va to the value Vdd+Vbe(D7) (where Vbe(D7) is the voltage between the base and the emitter of the diode D7), thus avoiding the destruction of the MOS transistor N3 due to inverse breakdown of its well junction.

The above-described circuit 1 overcomes the limitations imposed by the technology for comparator circuits with a negative threshold. The circuit 1 has zero consumption in the inactive mode and uses a minimal number of components. In this manner, a dual comparator with arbitrarily set positive and negative thresholds for single supply circuits is obtainable. Furthermore, the basic components of the circuit are produced with standard BiCMOS technologies with minimum silicon implementation dimensions.

Figure 5:
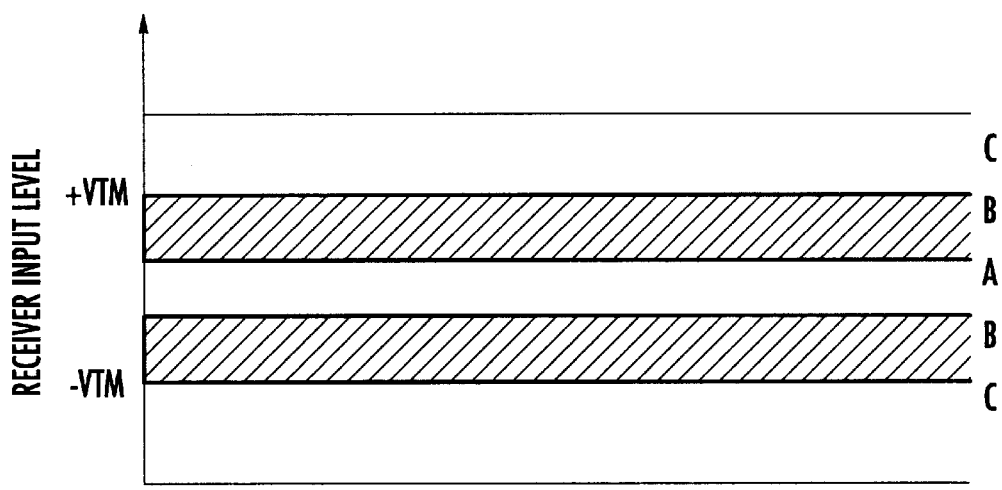
FIG. 5 is a chart which plots the operating areas of the circuit according to the present invention.

FIG. 5 illustrates the operating areas of the wake-up system according to the invention. FIG. 5 plots the input level of the receiver on the axis of the ordinates and the operating areas related to the value assumed by the input signal on the axis of the abscissas. FIG. 5 furthermore illustrates a plurality of areas, designated by the reference letters A, B and C. In the operating areas designated by the letter A, the circuit according to the invention must detect the absence of the input signal or disconnection of the data line and place the circuit in the quiescent state with zero consumption.

When the level of the signal applied to the input Rin corresponds to a value which lies inside the areas designated by B, the circuit is an indeterminate operating stage. If instead the level of the signal applied to the input Rin belongs to the areas designated by C, the circuit must enable the device, activating all its functions In the case of the serial interface, this means presetting the interface for receiving signals and retransmitting them.

In practice it has been observed that the circuit according to the invention achieves the above objects, since it provides a dual comparator with positive and negative thresholds having zero consumption for single-supply circuits with components produced using standard BiCMOS technologies.

Numerous modifications and variations are possible with respect to the circuit 1, all of which are within the scope of the inventive concept. For example, it is possible to vary the comparison thresholds of the comparator circuit independently of each other by varying the dimensions of the MOS transistor 11 of FIG. 6 or the dimensions of the MOS transistor N2 of FIG. 7.

Also, further diodes could be added in a number equal to nd in series with respect to D4 and D1, and D2 and D3, respectively. The positive threshold can vary in range Vth(11)<Vtm+<[Vdd−Vth(10)] and the negative threshold can vary in the range −nd*Vbe+Vth(N2)]<Vtm−<−[Vbe(D4)+Vth(N2)], where Vth always designates the threshold voltage of the transistor, in this case of the transistors 11 and N2. Furthermore, the elements described above may be replaced with other technically equivalent elements.

The disclosure in Italian Patent Application No. MI99A000945 from which this application claims priority is hereby incorporated herein in its entirety by reference That which is claimed is:

1. A comparator circuit for positive and negative input signals having substantially zero consumption in a quiescent state and suitable for devices with a single power supply, the comparator circuit comprising:

first and second comparators connected in parallel and receiving a common input signal and, respectively, a first positive threshold voltage and a second negative threshold voltage, said first and second comparators being respectively suitable to detect the crossing by the common input signal of the first and second threshold voltages, said second comparator comprising a first circuit branch connected to a supply voltage and comprising a p-channel enhancement-type MOS transistor and first and second n-channel enhancement-type MOS transistors series-connected and having gate terminals common-connected to a reference voltage, and a second circuit branch comprising a plurality of diodes, said plurality of diodes being series-connected and further connected between the reference voltage and an input terminal receiving the common input signal;

at least one logic circuit connected to said first and second comparators; and a delay circuit connected to said at least one logic circuit.

2. The comparator circuit according to claim 1 wherein the supply voltage is a positive supply voltage.

3. The comparator circuit according to claim 1 wherein said second comparator further comprises at least one diode connected between said n-channel and p-channel enhancement-type MOS transistors and the input terminal.

4. The comparator circuit according to claim 3 wherein said at least one diode has an anode and a cathode; and wherein the anode is connected to the source of one of said n-channel enhancement-type MOS transistors and the cathode is connected to the input terminal.

5. The comparator circuit according to claim 3 wherein said at least one diode has a cathode; and wherein said second comparator comprises another diode connected between the cathode and the supply voltage.

6. The comparator circuit according to claim 1 wherein said second comparator comprises first and second diodes; and wherein said first diode is connected between the supply voltage and the reference voltage, and said second diode is connected between the input terminal and the reference voltage.

7. The comparator circuit according to claim 1 wherein said second comparator further comprises a resistor connected between the input terminal and said second circuit branch.

8. The comparator circuit according to claim 1 wherein said first and second n-channel enhancement-type MOS transistors are electrically equivalent to a single n-channel enhancement-type MOS transistor.

9. The comparator circuit according to claim 1 wherein said first comparator comprises a CMOS inverter.

10. The comparator circuit according to claim 9 wherein said CMOS inverter comprises a p-channel MOS transistor and an n-channel MOS transistor, and wherein said n-channel MOS transistor is larger than said p-channel MOS transistor.

11. The comparator circuit according to claim 1 wherein said at least one logic circuit comprises an AND gate having two inputs connected to outputs of said first and second comparators.

12. The comparator circuit according to claim 11 wherein said at least one logic circuit comprises a NAND gate having an input connected to an output of said AND gate.

13. A comparator circuit for positive and negative input signals having substantially zero consumption in a quiescent state and suitable for devices with a single power supply, the comparator circuit comprising:

first and second comparators connected in parallel and receiving a common input signal and, respectively, a first positive threshold voltage and a second negative threshold voltage, said first and second comparators being respectively suitable to detect the crossing by the common input signal of the first and second threshold voltages, said second comparator comprising a first circuit branch connected to a supply voltage and comprising a p-channel enhancement-type MOS transistor and first and second n-channel enhancement-type MOS transistors series-connected and having gate terminals common-connected to a reference voltage and a second circuit branch comprising a plurality of diodes, said plurality of diodes being series-connected and further connected between the reference voltage and an input terminal receiving the common input signal.

14. The comparator circuit according to claim 13 wherein the supply voltage is a positive supply voltage.

15. The comparator circuit according to claim 13 wherein said second comparator comprises first and second diodes; and wherein said first diode is connected between the supply voltage and the reference voltage, and said second diode is connected between the input terminal and the reference voltage.

16. The comparator circuit according to claim 13 wherein said second comparator further comprises a resistor connected between the input terminal and said second circuit branch.

17. The comparator circuit according to claim 13 wherein said first and second n-channel enhancement-type MOS transistors are electrically equivalent to a single n-channel enhancement-type MOS transistor.

18. A comparator circuit with negative threshold and substantially zero consumption in static conditions, and supplied by a supply voltage and receiving a common input signal, the comparator circuit comprising:
a first circuit branch connected to the supply voltage comprising a p-channel MOS transistor and first and second n-channel MOS transistors series-connected and having gate terminals common-connected to a reference voltage; and
a second circuit branch comprising a plurality of diodes, said plurality of diodes being series-connected and further connected between the reference voltage and an input terminal receiving the common input signal.

19. The comparator circuit according to claim 18 further comprising a resistor connected between the input terminal and said second circuit branch.

20. The comparator circuit according to claim 18 wherein said first and second n-channel MOS transistors are electrically equivalent to a single n-channel MOS transistor.

21. The comparator circuit according to claim 18 further comprising at least one diode connected between said p-channel and n-channel MOS transistor s and the input terminal.

22. The comparator circuit according to claim 21 wherein said at least one diode has an anode and a cathode; and wherein the anode is connected to the source of said second n-channel MOS transistor and the cathode is connected to the input terminal.

23. The comparator circuit according to claim 21 further comprising first and second diodes; and wherein said first diode is connected between the supply voltage and the reference voltage, and said second diode is connected between the input terminal and the reference voltage.

24. The comparator circuit according to claim 21 wherein said at least one diode has a cathode; and wherein the comparator circuit further comprises another diode connected between the cathode and the supply voltage.

25. A comparator circuit for positive and negative input signals comprising:
first and second comparators connected in parallel and receiving a common input signal and, respectively, a first positive threshold voltage and a second negative threshold voltage, said first and second comparators being respectively suitable to detect the crossing by the common input signal of the first and second threshold voltages, and said second comparator comprising
a first circuit branch connected to a supply voltage comprising a p-channel MOS transistor and first and second n-channel MOS transistors mutually series-connected and having their gate terminals common-connected to a reference voltage, and
a second circuit branch comprising a plurality of diodes, said plurality of diodes being series-connected and further connected between the reference voltage and an input terminal receiving the common input signal;
a first logic circuit cascade-connected to said first and second comparators;
a second logic circuit cascade-connected to said first logic circuit; and
a delay circuit connected to said second logic circuit.

26. The comparator circuit of claim 25 wherein the comparator circuit has substantially zero consumption in a quiescent state.

27. The comparator circuit of claim 25 wherein said second comparator comprises at least one n-channel enhancement-type MOS transistor and at least one p-channel enhancement-type MOS transistor.

28. The comparator circuit according to claim 25 wherein said second comparator comprises first and second diodes; and wherein said first diode is connected between the supply voltage and the reference voltage, and said second diode is connected between the input terminal and the reference voltage.

29. The comparator circuit according to claim 25 wherein said second comparator further comprises a resistor connected between the input terminal and said second circuit branch.

30. The comparator circuit according to claim 25 wherein said first and second n-channel MOS transistors are electrically equivalent to a single n-channel MOS transistor.

31. A method for detecting the absence of at least one input signal on an interface device comprising:
comparing the at least one input signal and a first positive threshold voltage and providing a positive crossing signal indicating a crossing of the at least one input signal and the first threshold voltage using a first comparator;
comparing the at least one input signal and a second negative threshold voltage and providing a negative crossing signal indicating a crossing of the at least one input signal and the second negative threshold voltage using a second comparator connected in parallel with the first comparator and comprising a first circuit branch connected to a supply voltage and comprising a p-channel enhancement-type MOS transistor and first and second n-channel enhancement-type MOS transistors series-connected and having gate terminals common-connected to a reference voltage and a second circuit branch comprising a plurality of diodes, the plurality of diodes being series-connected and further connected between the reference voltage and an input terminal receiving the common input signal;

providing a wake-up signal upon the occurrence of the positive and negative crossing signals;

presetting at least one wake-up circuit to respond upon receiving the wake-up signal; and delaying the arrival of the wake-up signal to the at least one wake-up circuit by a predetermined duration.

32. The method of claim 31 wherein the absolute values of the first positive threshold voltage and second negative threshold voltage are equal.

33. The method of claim 31 wherein the providing the wake-up signal further comprises ANDing the positive and negative crossing signals.

34. A method for making a comparator circuit for positive and negative input signals having substantially zero consumption in a quiescent state and suitable for devices with a single power supply, the method comprising:

forming first and second comparators connected in parallel and receiving a common input signal and, respectively, a first positive threshold voltage and a second negative threshold voltage, said first and second comparators being respectively suitable to detect the crossing by the common input signal of the first and second threshold voltages, said second comparator comprising a first circuit branch connected to a supply voltage and comprising a p-channel enhancement-type MOS transistor and first and second n-channel enhancement-type MOS transistors series-connected and having gate terminals common-connected to a reference voltage and a second circuit branch comprising a plurality of diodes, the plurality of diodes being series-connected and further connected between the reference voltage and an input terminal receiving the common input signal.

35. The method according to claim 34 wherein said second comparator comprises first and second diodes; and wherein said first diode is connected between the supply voltage and the reference voltage, and said second diode is connected between the input terminal and the reference voltage.

36. The comparator circuit according to claim 34 wherein said first and second n-channel enhancement-type MOS transistors are electrically equivalent to a single n-channel enhancement-type MOS transistor.

* * * * *

UNITED STATES PATENT AND TRADEMARK OFFICE
CERTIFICATE OF CORRECTION

PATENT NO. : 6,362,663 B1
DATED : March 26, 2002
INVENTOR(S) : Marcello Criscione and Sergio Franco Pioppo It is certified that error appears in the above-identified patent and that said Letters Patent is hereby corrected as shown below:

<u>Title page,</u>
Item [73], delete "S.R.L." insert -- S.r.l --

<u>Column 1,</u>
Line 16, delete "microprocessor The" insert -- microprocessor. The --
Line 20, delete "system When" insert -- system. When --
Line 31, delete "pull-own" insert -- pull-down --

<u>Column 2,</u>
Line 41, delete "means" insert -- means. --

<u>Column 3,</u>
Line 20, delete "voltage/-Vtm" insert -- voltage - Vtm --
Line 20, delete "D1 connected" insert -- D1 is connected --

<u>Column 4,</u>
Line 5, delete "R1 The" insert -- R1. The --

<u>Column 5,</u>
Line 35, delete "functions In" insert -- functions. In --

<u>Column 7,</u>
Line 54, delete "transistor s" insert -- transistors --

Signed and Sealed this

Ninth Day of July, 2002

*Attest:*

JAMES E. ROGAN
*Attesting Officer*     *Director of the United States Patent and Trademark Office*

UNITED STATES PATENT AND TRADEMARK OFFICE
CERTIFICATE OF CORRECTION

PATENT NO. : 6,362,663 B1
DATED : March 26, 2002
INVENTOR(S) : Marcello Criscione and Sergio Franco Pioppo It is certified that error appears in the above-identified patent and that said Letters Patent is hereby corrected as shown below:

Title page,
Item [73], delete "S.R.L." insert -- S.r.l. --

Column 1,
Line 16, delete "microprocessor The" insert -- microprocessor. The --
Line 20, delete "system When" insert -- system. When --
Line 31, delete "pull-own" insert -- pull-down --

Column 2,
Line 41, delete "means" insert -- means. --

Column 3,
Line 20, delete "voltage/-Vtm" insert -- voltage - Vtm --
Line 20, delete "D1 connected" insert -- D1 is connected --

Column 4,
Line 5, delete "R1 The" insert -- R1. The --

Column 5,
Line 35, delete "functions In" insert -- functions. In --

Column 7,
Line 54, delete "transistor s" insert -- transistors --

This certificate supersedes Certificate of Correction issued July 9, 2002.

Signed and Sealed this

Twenty-seventh Day of August, 2002

*Attest:*

JAMES E. ROGAN
*Attesting Officer*     *Director of the United States Patent and Trademark Office*